United States Patent [19]
Ohkubo

[11] Patent Number: 6,153,908
[45] Date of Patent: Nov. 28, 2000

[54] BURIED-GATE SEMICONDUCTOR DEVICE WITH IMPROVED LEVEL OF INTEGRATION

[75] Inventor: Hiroaki Ohkubo, Tokyo, Japan

[73] Assignee: NEC Corporation, Tokyo, Japan

[21] Appl. No.: 09/305,212

[22] Filed: May 5, 1999

[30] Foreign Application Priority Data

May 8, 1998 [JP] Japan .................... 10-125547

[51] Int. Cl.[7] .................................................. H07L 29/78
[52] U.S. Cl. ............................................. 257/330; 257/372
[58] Field of Search ..................... 257/330, 372, 257/373

[56] References Cited

U.S. PATENT DOCUMENTS

| | | | |
|---|---|---|---|
| 4,243,997 | 1/1981 | Natori et al. | 257/330 |
| 5,808,340 | 9/1998 | Wollesen et al. | 257/330 |

FOREIGN PATENT DOCUMENTS

| | | |
|---|---|---|
| 53-144686 | 12/1978 | Japan . |
| 63-86569 | 4/1988 | Japan . |
| 63-114174 | 5/1988 | Japan . |
| 2-194560 | 8/1990 | Japan . |
| 3-135062 | 6/1991 | Japan . |
| 5-36628 | 2/1993 | Japan . |
| 9-64359 | 3/1997 | Japan . |

*Primary Examiner*—David Hardy
*Attorney, Agent, or Firm*—Sughrue, Mion, Zinn, Macpeak & Seas, PLLC

[57] ABSTRACT

In a semiconductor device in which a source and a drain are formed on both sides of a buried gate provided in a trench, metal wires for the source and the drain are provided above the source and drain, via an intervening interlayer insulation film, a wire for a gate being provided so as to be sandwiched between the source and drain wires, this being formed on the same level of interconnect layers as the source and drain wires and being formed over the gate.

4 Claims, 7 Drawing Sheets

BURIED-GATE SEMICONDUCTOR DEVICE WITH IMPROVED LEVEL OF INTEGRATION

BACKGROUND OF THE INVENTION

1. Field of the Invention

The present invention relates to a semiconductor device and a method for manufacturing a semiconductor device, and more particularly to a semiconductor device that features improved level of integration of a buried-gate semiconductor device, and a method of manufacturing such a semiconductor device.

2. Description of the Related Art

FIG. 8 and FIG. 9 are cross-sectional views that show the process steps for manufacturing a MOSFET device as disclosed in the Japanese Unexamined Patent Publication No. 63-114174, Japanese Unexamined Patent Publication No. 2-194560, respectively.

First, as shown in FIG. 8 (a), an oxide film 202 pattern is formed on a silicon substrate 201, this being used as a mask to etch the silicon substrate, thereby forming a trench 203 as shown in FIG. 8 (b). Next, as shown in FIG. 8 (c), after forming a gate oxide film 204 on the surface of the substrate, the polysilicon film 205 and resist 206 are deposited over the entire surface. Then, the entire surface of the resist 206 and the polysilicon film 205 is etched, so as to have the polysilicon film remain inside the trench 203 only, this forming a gate electrode 207, as shown in FIG. 8 (d). Then, as shown in FIG. 8 (e), after forming a gate protective film 208 on the gate electrode 207, ion implantation of a dopant is done, so as to form a low-resistance layer 209, which will serve as a source and drain, on the surface of the silicon substrate. Then, as shown in FIG. 8 (f), an interlayer insulation film 210 is deposited on the substrate 201, after which via holes are formed and the metal wire 211 is formed to fill them and be contact with the source and drain.

Turning to FIG. 9, first as shown in FIG. 9 (a) a trench 303 is formed in a silicon substrate 301. Next, as shown in FIG. 9 (b), after forming a gate insulation film 304 on the substrate surface, polysilicon is deposited over the entire surface, and this is patterned so as to form a gate electrode 307. Then, as shown in FIG. 9 (c), the gate electrode 307 is used as a mask to perform ion implantation of a dopant, thereby forming an n-type diffusion layer 312, which will serve as a source and drain, on the surface of the substrate. Next, as shown in FIG. 9 (d), an interlayer insulation film 310 is deposited onto the substrate, after which via holes are formed and, as shown in FIG. 9 (e), a metal wire 311 is formed to fill them and be contact with the source and drain.

With a buried-gate type MOSFET fabricated as described above, as shown in the plan view of FIG. 10, in order to make a connection between the MOSFET gate electrodes 207 and 307 and the metal wire 320, it is necessary to have a region for a via hole 321 by widening the gate pattern on the outside of the diffusion layer 330 (on an isolation film), this representing a hindrance to achieving a high level of integration. Although in two examples of prior art as described above, a description of the plan views will be omitted, these have the same type of drawbacks as in a general type of MOSFET. With the device of FIG. 9, because of insufficient flatness on the surface of the interlayer insulation film, photolithography is problematic, because there is an insufficient focussing margin when performing metalization across step parts and reflections therefrom, this leads to such problems as incomplete etching, which can cause such problems as open or shorted wires.

The reason for the above is that, when a via hole, for the purpose of connecting a MOSFET gate electrode to a metal wire, is located in a channel region, in the case in which the gate length is approximately the same as the contact diameter, positioning offset causes a short circuit with the drain and source. Therefore, this via hole must inevitably be placed outside the diffusion layer, as shown in FIG. 7. Additionally, because a gate electrode or part thereof over the substrate forms a step thereon, the interlayer insulation film upper surface, reflecting this surface, loses its flatness.

Accordingly, it is an object of the present invention to improve over the drawbacks of the prior art as described above, by particularly providing a novel buried-gate type semiconductor device which enables the achievement of an interlayer insulation film with a flat upper surface, and which, by doing so, eliminates trouble such as opens and shorts in the interconnect layer, thereby improving yield. It is an additional object of the present invention to provide a method for manufacturing the above-noted semiconductor device.

Yet another object of the present invention is to provide a buried-gate type semiconductor device within improved level of integration, and a method for manufacturing such a semiconductor device.

SUMMARY OF THE INVENTION

In order to achieve the above-noted object, the present invention adopts the following basic technical constitution.

Specifically, the first aspect of a semiconductor device according to the present invention is a semiconductor device in which a source and drain are formed on both sides of a buried gate provided within a trench, wherein metal wires for the above-noted source and drain are provided on the source and drain respectively, via an intervening interlayer insulation film, a gate wire being formed so as to be sandwiched between the above-noted source and drain wires, this gate wire being formed on the same level of interconnect layer as the source and drain wires and also formed over the gate.

In the second aspect of a semiconductor device according to the present invention, a material that connects the gate electrode of the buried gate with a wire of the above-noted interconnect layer is the same material as the above-noted gate electrode.

In the third aspect of a semiconductor device according to the present invention, a gate insulation film that is provided between the trench and the gate electrode is provided on a side wall and a bottom of a trench in the interlayer insulation film.

The first aspect of a method for manufacturing a semiconductor device according to the present invention is a method for manufacturing a semiconductor device in which a source and drain are formed on both sides of a buried gate provided within a trench, this method comprising; a first step of performing first ion implantation for forming a semiconductor region having a second conductivity on a surface of a semiconductor substrate, a second step of performing second ion implantation for forming a diffusion layer of a first conductivity, which will serve as a source and drain region, on a surface of the above-noted semiconductor region of the second conductivity, a third step of performing depositing an insulation film on the surface of the above-noted semiconductor substrate, and etching a part of the surface of the substrate and the above-noted insulation film so as to form a trench, a fourth step of forming a gate insulation film on a surface of the substrate, including the bottom and side surfaces within the trench, a fifth step of filling the trench with a conductor, and a sixth step of etching the insulation film so as to form a first via hole that extends to the above-noted diffusion layer of the first conductivity.

The second aspect of a method of manufacturing a semiconductor device according to the present invention further has a seventh step of filling the first via hole with a conductor, and an eighth step of forming a metal wire that connects the conductor within the first via hole and the conductor within the trench.

In the third aspect of a method of manufacturing a semiconductor device according to the present invention, the same photoresist mask is used in the first ion implantation and the second ion implantation.

In the fourth aspect of a method of manufacturing a semiconductor device according to the present invention, in the sixth step, a second via hole, which completely passes through the isolation film which isolates diffusion layers on a surface of the semiconductor substrate and extends to the semiconductor region of the second conductivity is simultaneously formed.

In the fifth aspect of a method of manufacturing a semiconductor device according to the present invention, a third ion implantation is performed using the first via hole.

In the sixth aspect of a method of manufacturing a semiconductor device according to the present invention, a fourth ion implantation is performed using the second via hole.

A semiconductor device according to the present invention is formed by a trench which is opened on an insulation film formed on a substrate, a gate insulation film that is formed on the substrate surface with the trench, a gate electrode which is made of a conductor that fills the trench, a source-drain diffusion layer that is defined by the trench and the insulation film for isolation (isolation film), a contact plug that makes connection to the source-drain diffusion layer, and interconnect layers that make connections the gate electrodes within the trench and the contact plug.

The method of manufacturing the above-noted semiconductor device includes a step of performing a first ion implantation for forming a well in the substrate surface, a step of performing a second ion implantation for forming a diffusion region within the well, a step of depositing an insulation film on the substrate and etching a part of the insulation film and a part of the substrate surface to form a trench, a step of forming a gate insulation film on the substrate surface, including the bottom and side surfaces within the trench, a step of filling the trench with a conductor, a step of etching the insulation film so as to form via holes that reach the diffusion layers, a step of filling the via holes with conductors, and a step of forming a metal wire on the insulation film so as to connect conductors in the trench and in the via holes.

DESCRIPTION OF THE PREFERRED EMBODIMENTS

Embodiments of a semiconductor device according to the present invention and a method for manufacturing such a semiconductor device are described below in detail, with references being made to relevant accompanying drawings.

Figure 1:
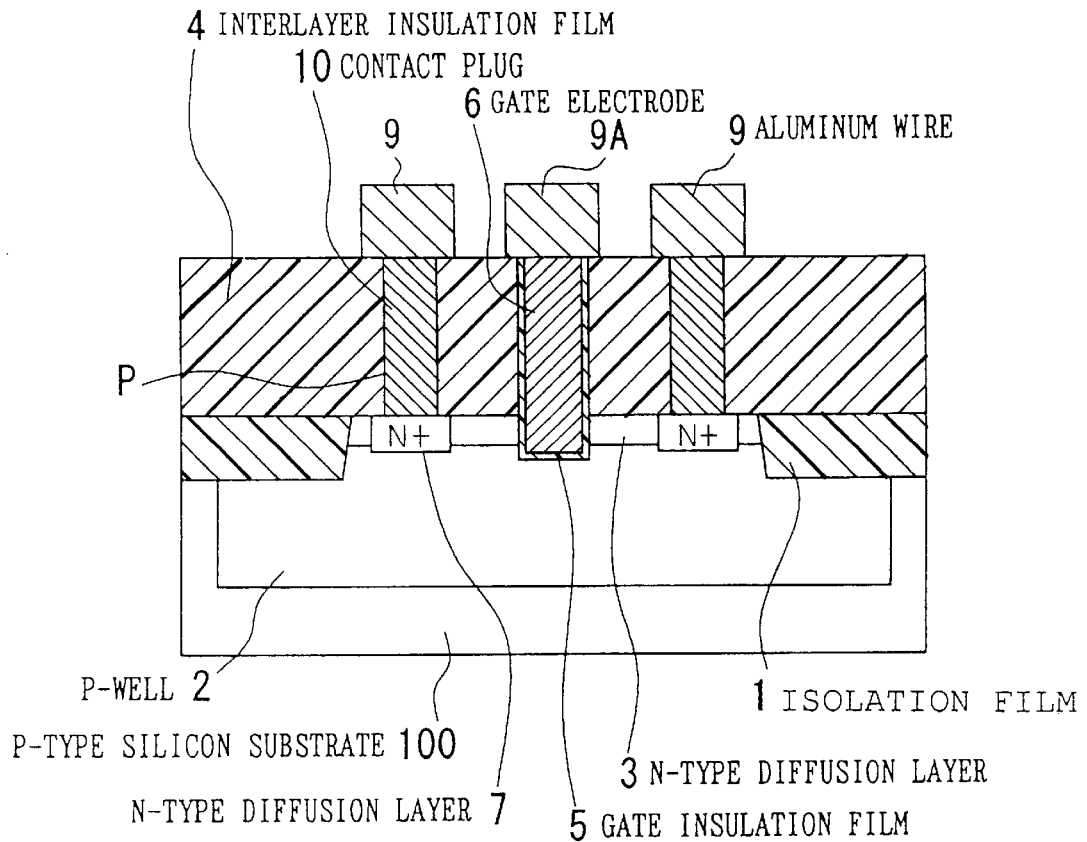
FIG. 1 is a cross-sectional view of a semiconductor device according to the present invention.
Figure 5:
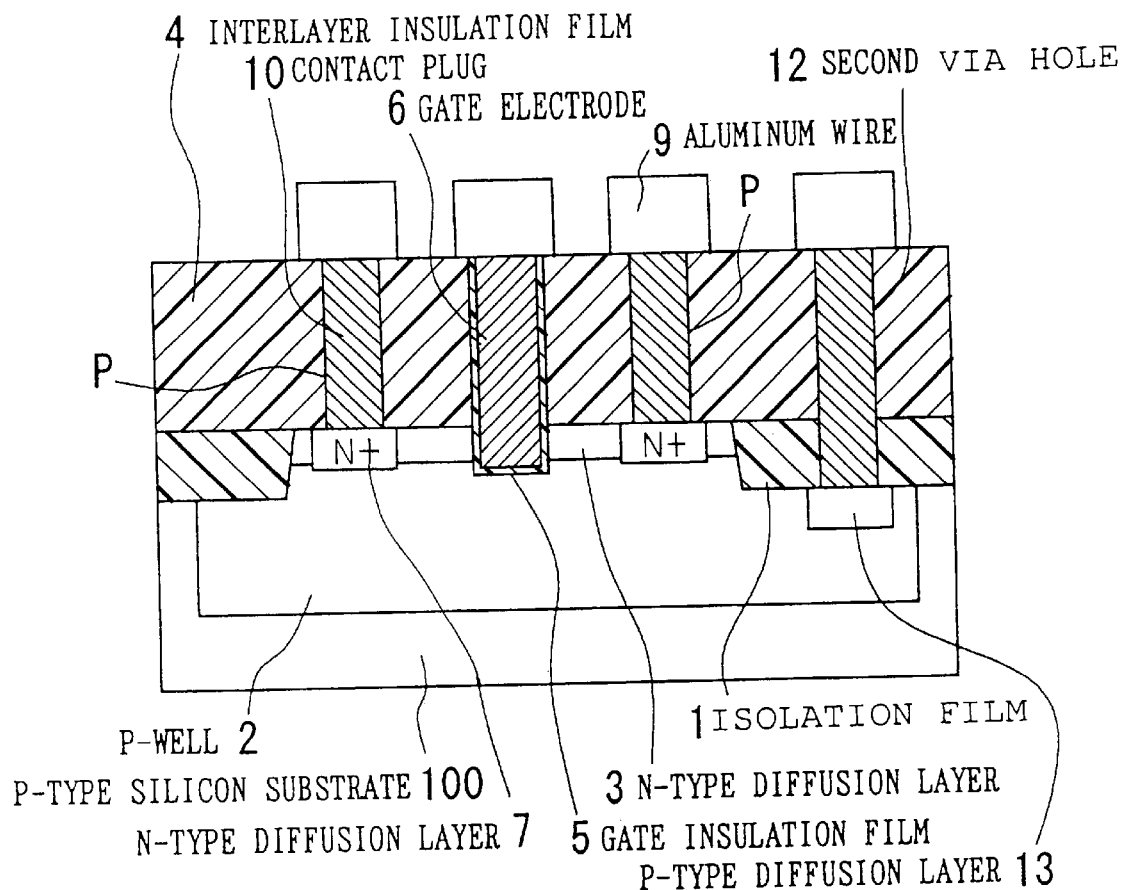
FIG. 5 is a cross-sectional view of a semiconductor device according to the second example of the present invention.

FIG. 1 and FIG. 5 are drawings which illustrate specific examples of the structure of a semiconductor device according to the present invention. These drawings show a semiconductor device in which a source and a drain are formed on both sides of a buried gate 6 that is provided within a trench 8, metal wires 9 for source and drain being provided on the above-noted source and drain, via an intervening interlayer insulation film 4, and a gate wire 9A being formed so as to be sandwiched between the above-noted wires 9, this gate wire 9A being formed on the same level of interconnect layer as wires 9 and also formed over the gate 6.

The material that connects the gate electrode 6 of the buried gate with a wire 9A on the above-noted insulation layer 4 is the same material as the above-noted gate electrode 6.

Additionally, a gate insulation film 5 that is provided between the trench 8 and the gate electrode 6 is provided also on a wall part 8a of a trench 8 in the interlayer insulation film 4.

Next, a more specific example of the present invention will be described.

The first example of the present invention will be described, with references being made to FIG. 1 through FIG. 5.

Figure 2:
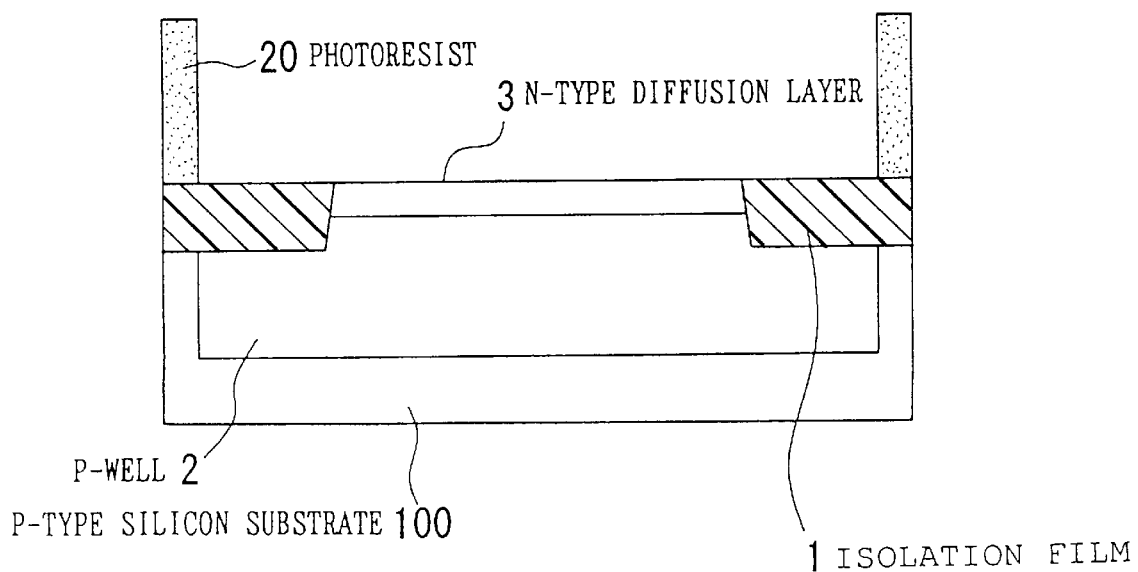
FIG. 2 is a cross-sectional view that illustrates the process steps for manufacturing the first example of the present invention.
Figure 3:
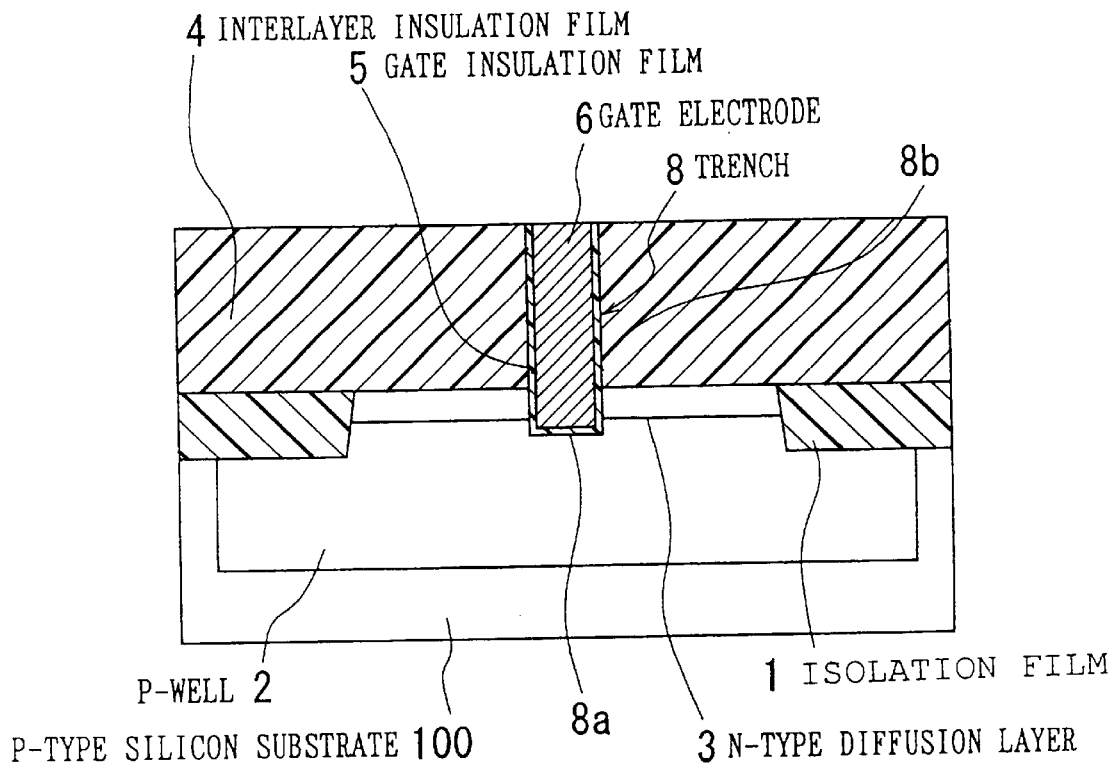
FIG. 3 is a cross-sectional view that illustrates the process steps for manufacturing subsequent to those shown in FIG. 2.
Figure 4:
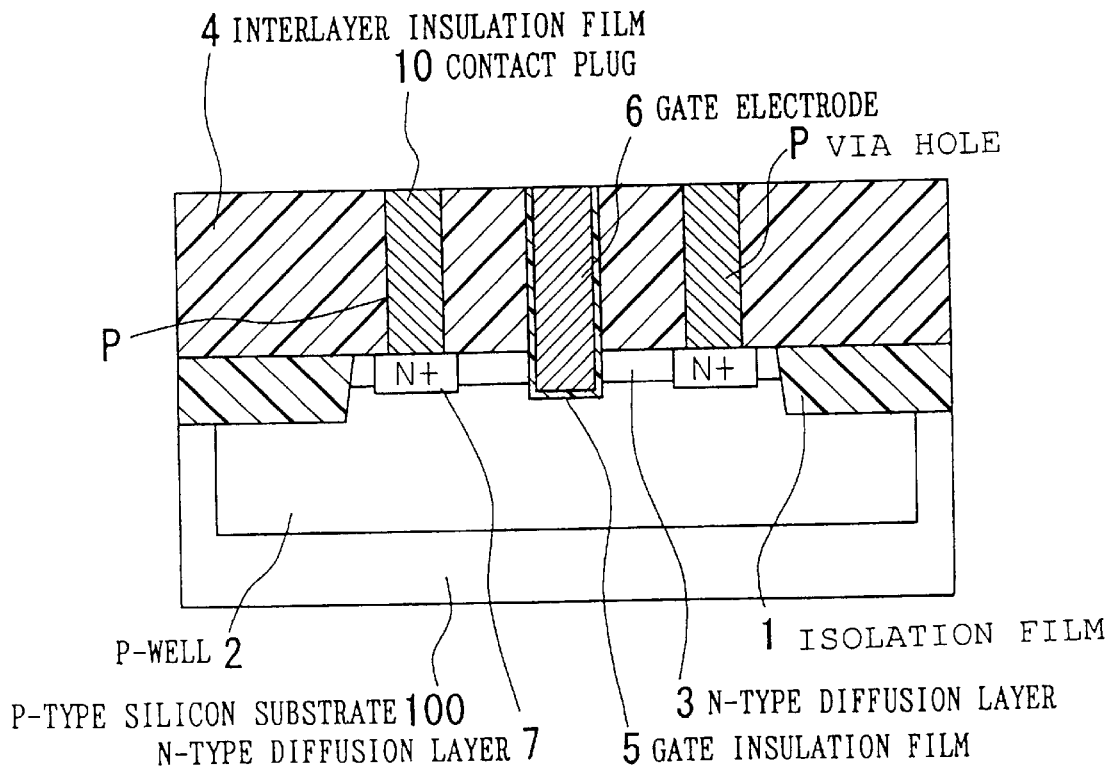
FIG. 4 is a cross-sectional view that illustrates the process steps for manufacturing subsequent to those shown in FIG. 3.
Figure 6:
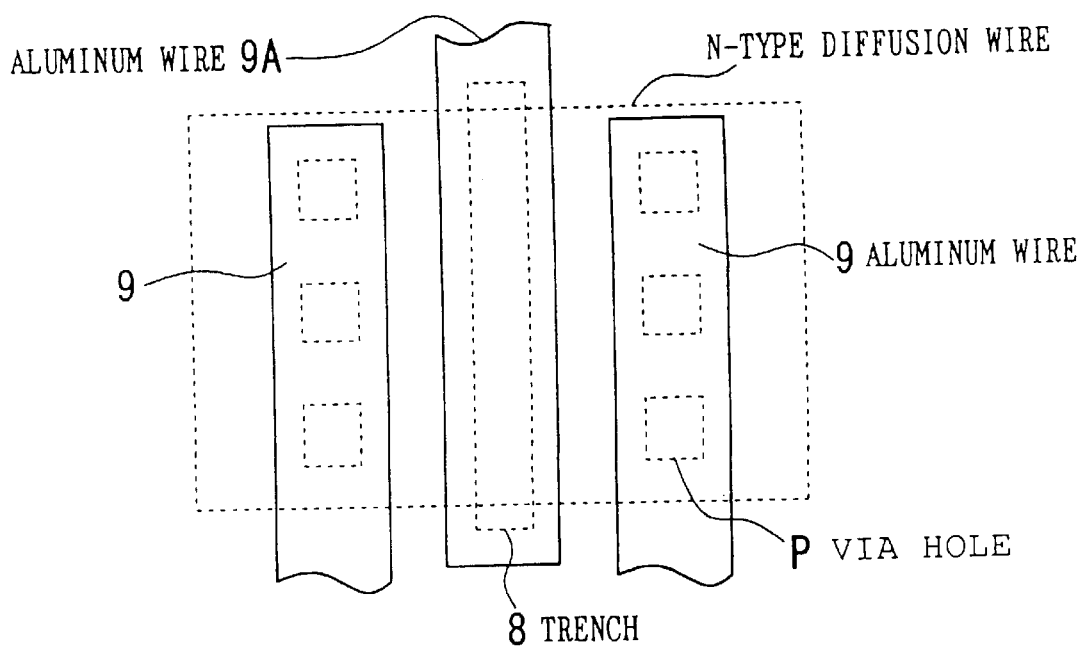
FIG. 6 is a plan view of a semiconductor device according to the present invention.

FIG. 1 is a cross-sectional view of a MOSFET according to the present invention, FIG. 2 through FIG. 4 are cross-sectional views that illustrate the process steps for manufacturing this device, and FIG. 6 is a plan view thereof.

As shown in FIG. 1, an n-channel MOSFET is formed within the p-well 2 on a p-type silicon substrate 100. An isolation film 1 is formed on an isolation region on the surface of the substrate, and an interlayer insulation film 4 is deposited onto the surface of the substrate. A trench 8 is formed on the channel formation region and the interlayer insulation film. This trench 8 is provided by etching the interlayer insulation film 4 and the surface of the substrate 100, a gate insulation film 5 being formed on the bottom and inside wall surfaces of the trench 8, and the trench 8 being further filled by a conductor, which will serve as the gate electrode 6. An n-type diffusion layer 3 is formed on the surface of the substrate, so that it is sandwiched between the trench 8 and the isolation film 1. The interlayer insulation film 4 is provided with a via hole P, this being filled with a contact plug 10 made of a conductor. The contact plug 10 makes contact at its bottom part with the n-type diffusion layer 3. Aluminum wires 9A and 9 are formed on the interlayer insulation film 4, these aluminum wires 9A and 9 being connected, respectively, to the gate electrode 6 and the contact plug 10. As shown in FIG. 5, the gate electrode 6 is buried in the trench 8, so that there is no need, as in the past, to position a via hole for the purpose of connecting the gate electrode and the aluminum wire, and there is no widening of the gate pattern on the outside of the n-type diffusion layer 3.

Next, a method of manufacturing this semiconductor device according to the present invention will be described, with references being made to FIG. 2 through FIG. 4.

As shown in FIG. 2, an isolation film 1 having a thickness of 2000 to 5000 Angstroms is formed on the isolation region of the surface of a p-type silicon substrate 100. The isolation film 1 is formed by local oxidation or burying a trench that is formed by etching of the silicon substrate surface. Then, using photoresist 20 as a mask, boron ion implantation and arsenic ion implantation are done, so as to form a p-well 2 and an n-type diffusion layer 3. For example, the boron ion implantation is done with an implantation energy of 200 to 500 keV, and an implantation dose of 1 to $3\times10^{13}$ cm$^{-2}$, and the arsenic ion implantation is done with an implantation energy of 30 to 90 keV and an implantation dose of $1\times10^{15}$ to $1\times10^{16}$ cm$^{-2}$. The photoresist 20 is applied so as to expose only the n-channel transistor formation region.

Next, referring to FIG. 3, in interlayer insulation film 4 is deposited over the entire surface, after which the trench 8 is formed in the MOSFET transistor channel formation region. This trench 8 is formed by selective etching of the interlayer insulation film 4 and the silicon substrate 100 surface, the silicon substrate surface being etched to the same as or a greater depth than the n-channel diffusion layer 3, so that the n-type diffusion layer 3 is formed so as to be divided into two. Therefore, the n-type diffusion layer 3 is divided into an n-type diffusion layer 3 that will serve as a source and an n-type diffusion layer 3 that will serve as a drain, these being sandwiched between the isolation film 1 and the trench 8. Next, boron ion implantation is done via the trench 8 into the p-well 2 directly below the bottom part 8a of the trench 8, the dopant concentration being adjusted so as to control the threshold voltage of the transistor. Next, a gate insulation film 5 having a thickness of 50 to 200 Angstroms, made of an oxide film, is formed within the trench 8, after which the inside of the trench 8 is filled by depositing and etching back a conductor 6 such as a polysilicon film or the like into which a dopant has been introduced.

Next, referring to FIG. 4, the interlayer insulation film 4 on the n-type diffusion layer 3 is etched so as to form a first via hole P. Then, phosphor ion implantation is done via this via hole P, so as to form an n-type diffusion layer 7, after which a metal such as tungsten is deposited and etched back so as to form a contact plug 10, which fills the first via hole P.

Finally, as shown in FIG. 1, aluminum wires 9 and 9A are formed on the interlayer insulation film 4. The aluminum wire 9A is directly connected to the gate electrode 6, and the aluminum wires 9 is connected to the n-type diffusion layer 3 that will be the source and the drain via the contact plug 10 and the n-type diffusion layer 7.

In this manner, the method of manufacturing a semiconductor device according to the present invention includes a first step of performing a first ion implantation for the purpose of forming a semiconductor region 2 of a second conductivity onto the semiconductor substrate 100, a second step of performing a second ion implantation for the purpose of forming a diffusion layer 7 of a first conductivity, which will be the source and drain regions, within the semiconductor region 2 of the second conductivity, a third step of depositing an insulation film 4 on the surface of the semiconductor substrate and etching this insulation film 4 and part of the semiconductor substrate 100 surface so as to form a trench 8, a fourth step of forming a gate electrode film 5 on the substrate surface, including the bottom surface 8a and side surface 8b inside the trench 8, a fifth step of filling the trench 8 with a conductor, and a sixth step of etching the insulation film 4 so as to form a first via hole P that reaches the diffusion layer 7 of the first conductivity.

Figure 7:
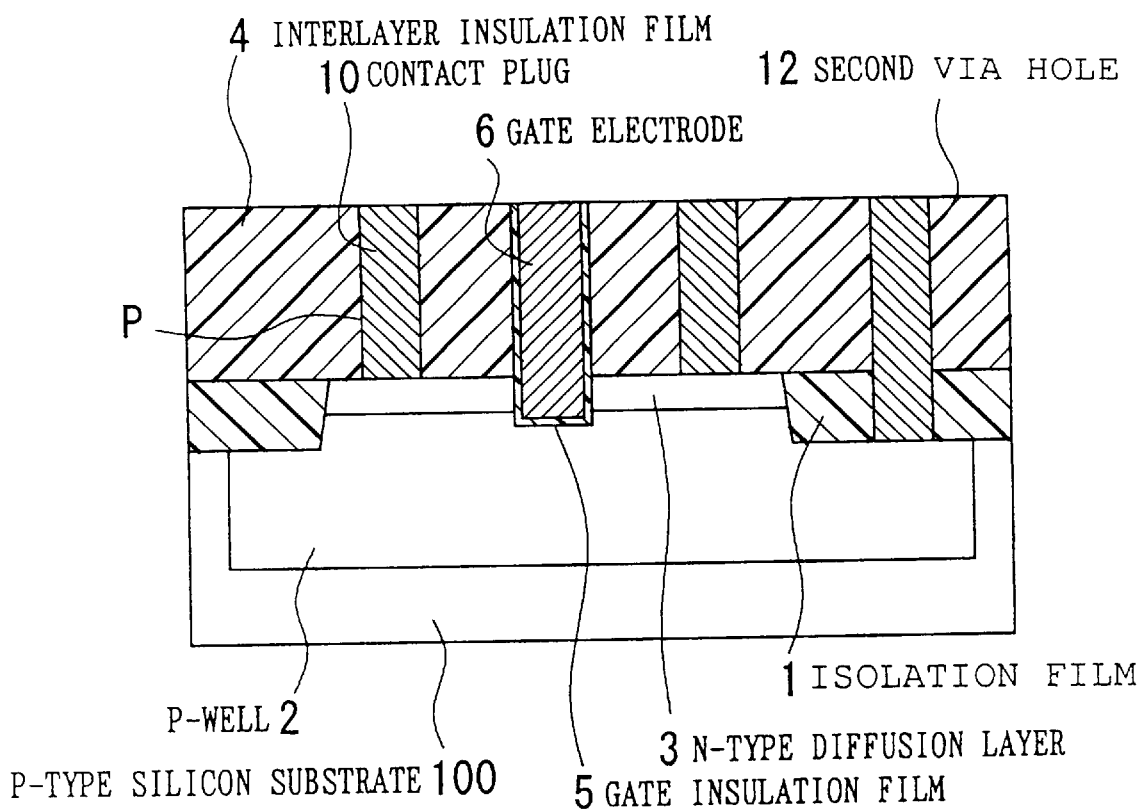
FIG. 7 is a cross-sectional view that illustrates the process steps for manufacturing the second example of the present invention.
Figure 8:
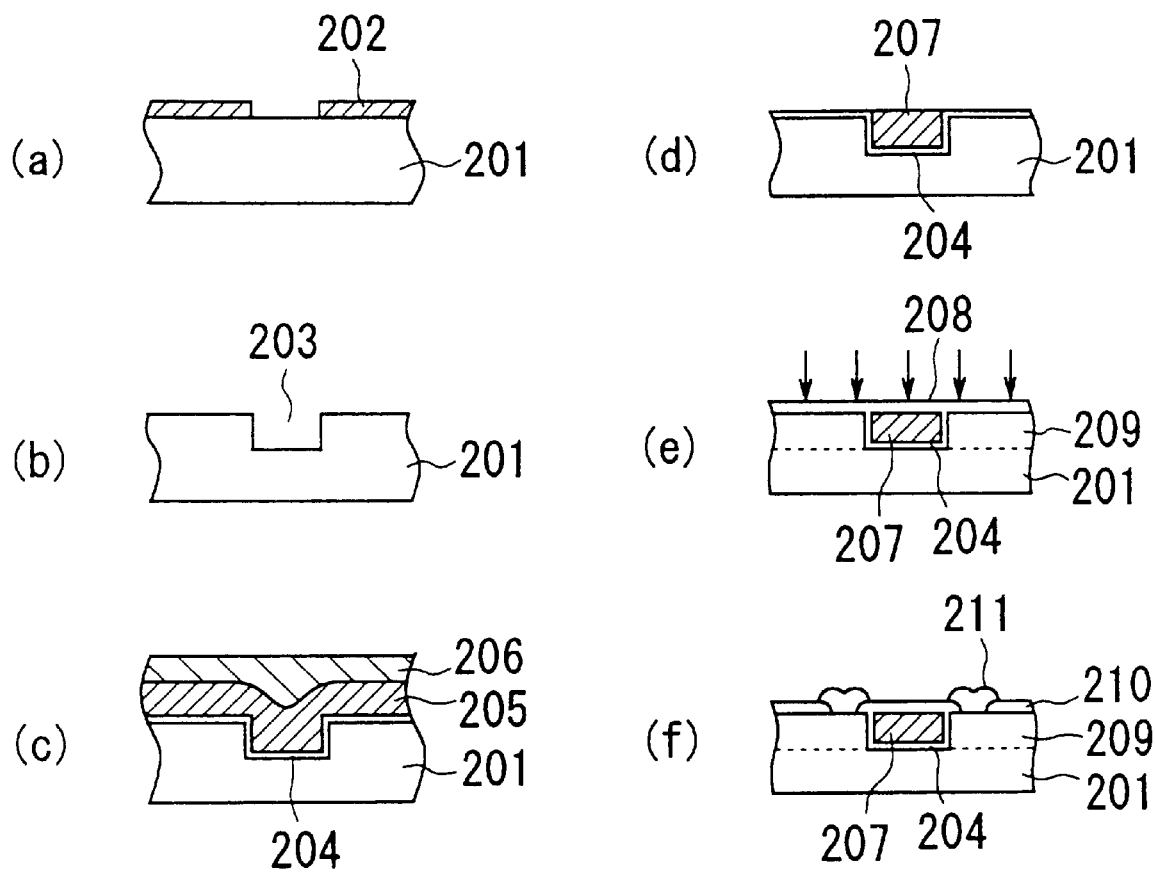
FIG. 8 is a drawing that illustrates the prior art.
Figure 9:
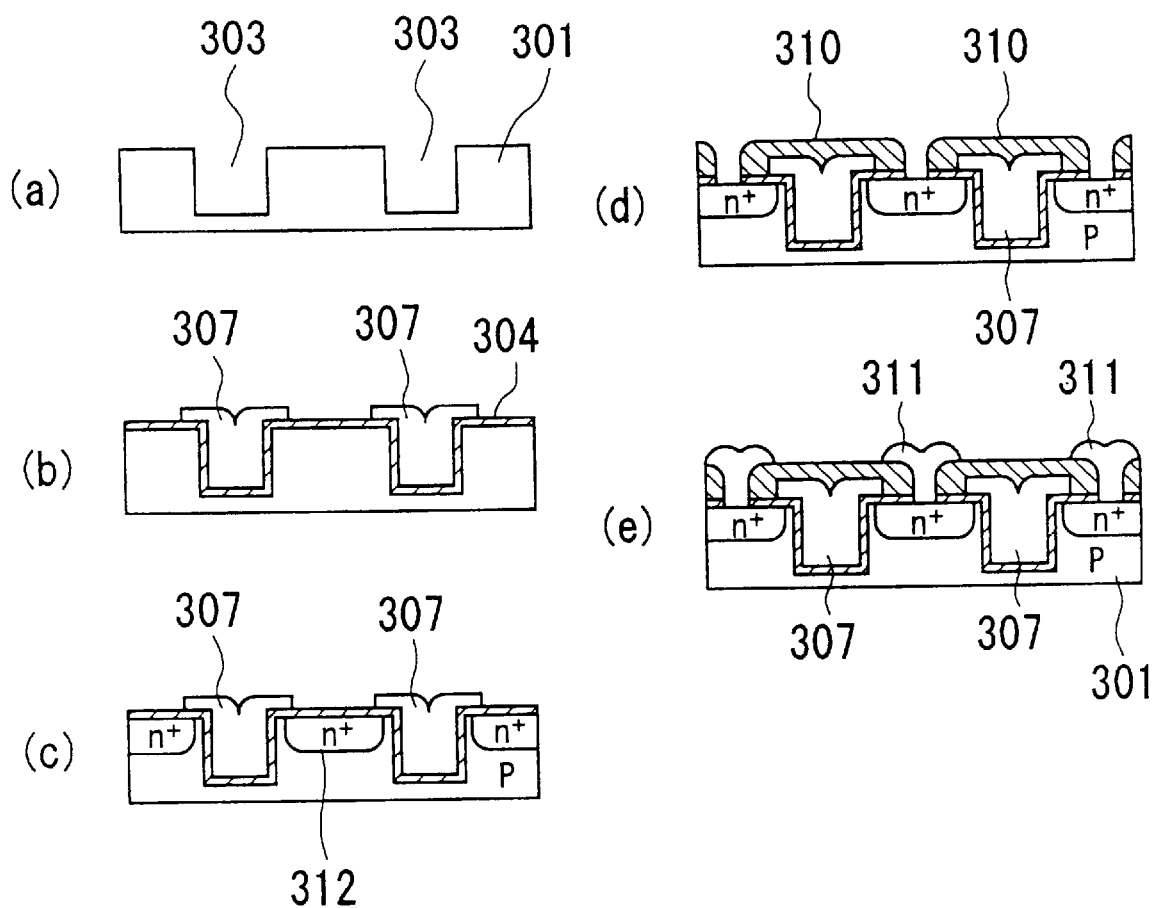
FIG. 9 is a drawing that illustrates the prior art.
Figure 10:
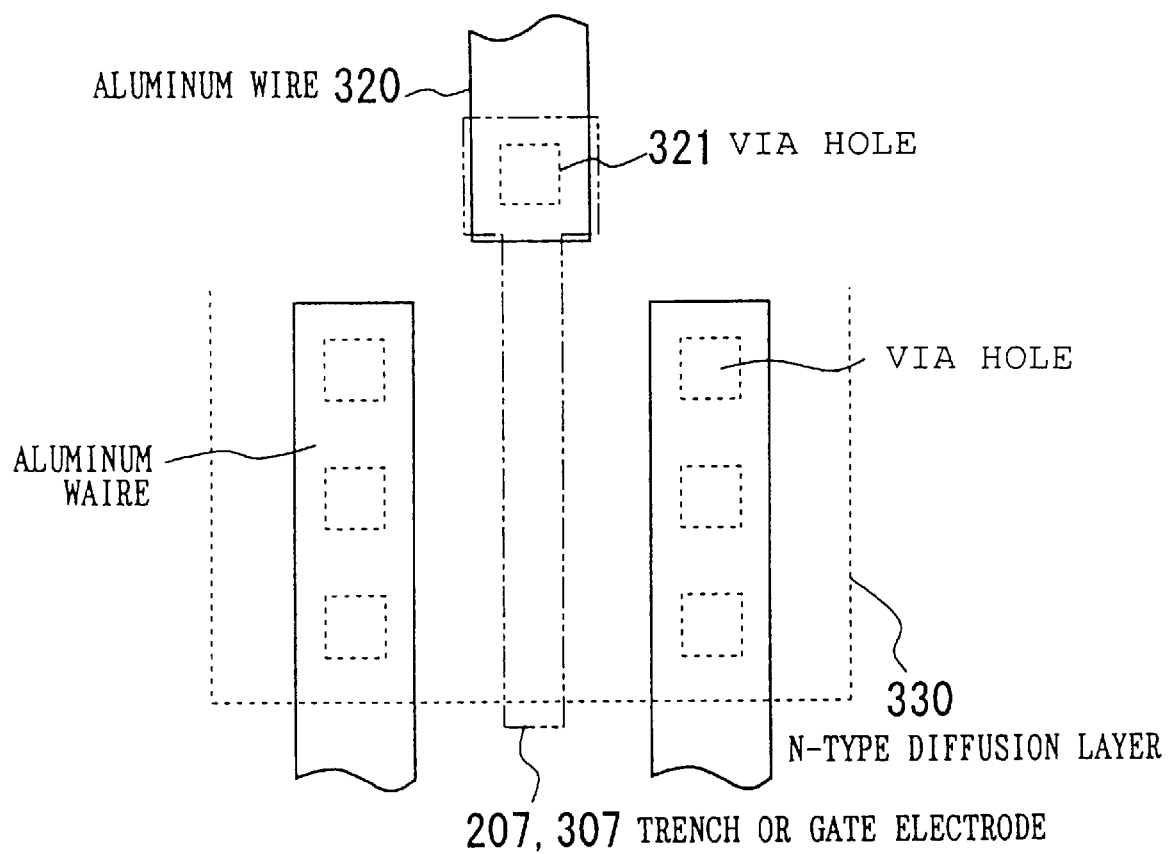
FIG. 10 is a plan view that illustrates the prior art.

A second example of the present invention is shown in FIG. 6 and FIG. 7. In this example, when forming a first via hole P on the diffusion layer, a second via hole 12 is formed. The second contact hole 12 is formed by selectively etching the interlayer insulation film 4 and the isolation film 1 so as to reach the p-well 2, this second via hole 12 being used to perform boron ion implantation within the p-well, thereby forming a p-type diffusion layer 13. In the CMOS process, it is possible to simultaneously form this second via hole 12 for the purpose of well connection when the via hole P is formed on the p-type diffusion layer of the p-channel transistor. Therefore, in the CMOS process, there is no excessive process step that is required for the formation of the via hole 12 for the purpose of well connection.

By adopting the constitution described above, the present invention eliminates the need to have a region for a gate pattern on the isolation film for the purpose of locating a contact for connection to the gate electrode and the aluminum wire (metal interconnect), thereby contributing an improvement in the level of element integration.

Additionally, because the interlayer insulation film surface is sufficiently flat without having to use a process to flatten the interlayer insulation film, it is possible to avoid such failures as opens and shorts, which are caused by insufficient photolithography focussing margin when performing metalization across the step parts and reflections therefrom.

Additionally, because it is possible to perform ion implantation for formation of the well and ion implantation for formation of the source and drain with a single resist mask formation step, in contrast to the prior art, in which these were done separately, it is possible to reduce the number of process steps.

The reason for this is that, as shown in FIG. 5, because with this type of gate electrode the gate electrode is formed within a trench in the interlayer insulation film, there is no need to provide a via hole on the gate pattern as was required in the past, the result being the elimination of the need to have an area for positioning a via hole in the isolation region. Another reason is that, by forming a gate insulation film within a trench that is formed in the channel region and filling this with a conductor for use as a gate electrode, the gate wire beneath the interlayer insulation film is eliminated, meaning that the gate wiring steps on the substrate is no longer needed when the interlayer insulation film is formed. Yet another reason is that it is possible to form the source and drain diffusion layer before forming the gate electrode.

What is claimed is:

1. A semiconductor device in which a source and drain are formed on both sides of a buried gate provided within a trench, wherein metal wires for said source and drain are provided on said source and drain, respectively, via an intervening interlayer insulation film, a gate wire being formed so as to be sandwiched between said source and drain wires, said gate wire being formed over said gate and on the same level of interconnect layer as said source and drain wires, wherein a material that connects said gate electrode of said buried gate with a wire of said interconnect layer is the same material as said gate electrode.

2. A semiconductor device according to claim 1, wherein a gate insulation film is provided between said trench and said gate electrode along the walls and bottom of said trench in said interlayer insulation film.

3. A semiconductor device comprising:

a buried gate electrode formed within a trench;

a source formed on one side of said buried gate electrode;

a drain formed on an opposite side of said buried gate electrode;

an intervening interlayer insulation film covering the source and the drain, said intervening interlayer insulation film having via holes containing contact plugs to connect said source and drain to corresponding source and drain connecting wires at an interconnect layer on a surface of said interlayer insulation film, and wherein the gate electrode formed in said trench is disposed through said interlayer insulation film such that a top of the gate electrode is flush with said interconnect layer on said surface of said interlayer insulation film, and wherein a gate connecting wire connects with the top of the gate electrode.

4. The semiconductor device according to claim 3, further comprising a gate insulation film disposed between the gate electrode and the interior walls of said trench.

* * * * *